April 22, 1969 H. R. CAMENZIND 3,440,648

INTEGRATED-CIRCUIT AMPLIFIER AND OSCILLATOR

Filed May 9, 1968

INVENTOR
HANS R. CAMENZIND
BY Charles W. Hoffmann
ATTORNEY

United States Patent Office 3,440,648

Patented Apr. 22, 1969

3,440,648

INTEGRATED-CIRCUIT AMPLIFIER AND OSCILLATOR

Hans R. Camenzind, Los Altos, Calif., assignor to P. R. Mallory & Co. Inc., Indianapolis, Ind., a corporation of Delaware Continuation-in-part of application Ser. No. 640,148, May 22, 1967. This application May 9, 1968, Ser. No. 727,879

Int. Cl. H03b 5/00

U.S. Cl. 340—388 9 Claims

ABSTRACT OF THE DISCLOSURE

A two-stage transistor amplifier, suitable for use as an oscillator with a resonant load, is disclosed. Base bias for the input transistor is derived from a diode in the output transistor emitter lead and a resistor. A third transistor having a base-biasing resistor and an emitter diode form a variable-impedance collector load circuit for the output transistor. This load circuit has a high impedance when the output transistor conducts and a low impedance when the output transistor does not conduct.

This application is a continuation-in-part of application Ser. No. 640,148 filed on May 22, 1967, and now abandoned.

The present invention concerns electrical amplifiers, and in particular an integrated-circuit amplifier suitable for use with a resonant load as an oscillator.

Biasing considerations become significant because of the suitability of such circuits for construction in the form of integrated circuits. Unless the transistors of an amplifier or oscillator circuit are biased in a stable manner, operation of the circuit becomes inefficient or unpredictable. In particular, the overall gain of the circuit must be controlled with some accuracy. Therefore, given the large tolerances of components with present integrated-circuit manufacturing techniques, a stable biasing method is an important factor.

Furthermore, oscillators of conventional design commonly operate in the class-A mode, which renders them comparatively inefficient in terms of their AC output power compared to their DC supply power. In many instances, high efficiency of an oscillator circuit is of little concern, since the oscillator is usually operated at a low power and is followed by one or more stages of amplification designed to achieve the requisite output power. There are, however, applications in which a low or medium power oscillator may itself provide sufficient power to drive a load; and many of these applications involve situations in which high efficiency becomes important because of limitations on the amount of DC power available for their use.

Accordingly, a primary objective of the present invention is to provide an amplifier or oscillator suitable for integration having a simple and stable biasing means.

Another primary object of the invention is to provide an integral oscillator having a high electrical efficiency.

Another object is to provide such an amplifier or oscillator which is simple and which may be inexpensively produced.

Further objects and advantages of the invention, as well as modifications obvious to one skilled in the art, will become apparent from the following description of preferred forms of the invention, taken in conjunction with the accompanying drawings, in which.

Generally speaking, the present circuits include a source of electrical potential and first and second transistor means, each having emitter, base and collector electrodes. The oscillator further includes a biasing circuit for the transistor means, a collector load resistor for the first transistor, a variable-impedance collector load circuit for the second transistor, and a resonant load connected between the load circuit and the base of the first transistor. The load circuit consists of a transistor means and a biasing means therefor configured in such a manner that the load-circuit transistor is rendered non-conducting when the second transistor of the oscillator conducts, and vice versa. The biasing means has a forward-biased diode in series with the emitter of the second transistor and a resistor connected from this diode to the base of the first transistor.

Figure 1:
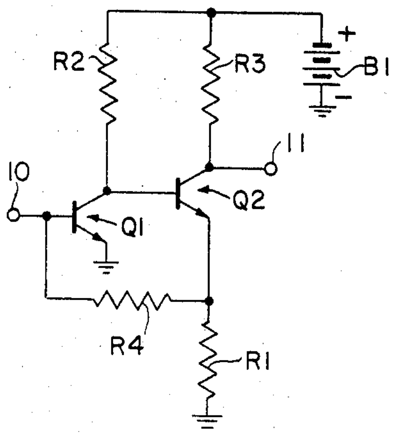
PRIOR ART FIG. 1
FIGURE 1 is a schematic diagram of a conventional two-stage transistor amplifier.

Referring more particularly to the drawing, FIGURE 1 illustrates a typical conventional transistor amplifier, having an input terminal 10 and an output terminal 11. Basically, this amplifier has two transistors Q1 and Q2 powered by a source of potential or battery B1 and connected in cascade. Resistors R1 and R4 provide base bias to Q1. The collector of Q1 and the base of Q2 may be directly coupled to each other, so that the resistor R2 supplies both collector bias to Q1 and base bias to Q2. A resistor R3 provides collector bias to the transistor Q2. Under these conditions, the resistors R1 and R4 provide degenerative feedback in the base bias of Q1; the current gain of the overall circuit is given by the ratio of R4 to R1, regardless of parameter variations in the remaining components.

Figure 2:
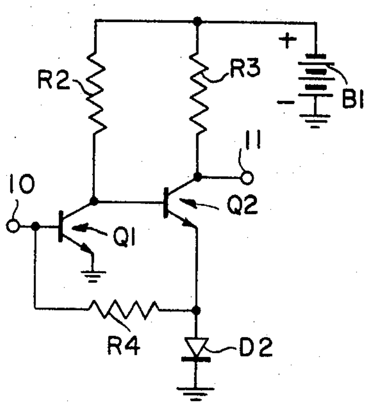
FIGURE 2 is a schematic of an amplifier having biasing means according to the invention.

Although the circuit of FIGURE 1 assures a constant gain with fairly wide component tolerances, it cannot provide large amounts of gain, since the maximum available resistance ratios obtainable in integrated circuits are in the range of about 100:1. Therefore, the total gain for both stages is limited to about 100, even if this maximum ratio can be utilized in view of design constraints on the other circuit components. FIGURE 2 shows a biasing circuit according to the present invention which overcomes this difficulty. In this circuit, a forward-biased diode D2 is substituted for the resistor R1, thus achieving a much smaller value of R1 and consequently increasing the stage gain. This substitution is made possible by the fact that the dynamic resistance $R_d$ of a forward-biased diode is inversely proportional to the current I flowing through it. More specifically, $$R_d=\frac{kT}{q}\cdot\frac{1}{I}$$

where $k$ is Boltzmann's constant, T is the temperature in degrees Kelvin and $q$ is the charge on an electron. At room temperature, the value of $kT/q$ is approximately 26 mv., so that $R_d$=26 ohms when $I$=1 ma. This value of $R_d$ is far below that obtainable with an integrated resistor of conventional types, even with a relatively low amount of current passing through the diode.

At first glance, this circuit may appear to sacrifice the advantages of the biasing circuit of FIGURE 1, in that one term of the ratio which establishes the total circuit gain is now dependent upon the emitter current of Q2. In an integrated circuit, however, the values of all resistances on the chip will increase or decrease together with uncontrollable production variations; but their ratios, which are predetermined by the geometry of a mask, will remain relatively constant. In FIGURE 1, for instance, this constant ratio involves R2 and R3, as well as the gain-control resistors R1 and R4. Returning to FIGURE 2, suppose that the resistors R2 and R3 turn out to be one-half of their design values. Then twice as much current will flow through R3 and Q2, which will halve the value of $R_d$. But the value of R4 will also be half its design value, so the ratio $R4/R_d$, and thus the total circuit gain, will remain constant. Therefore, since the ratio of R2, R3 and R4 is predictable and stable, the circuit gain may be predetermined accurately despite variations in the absolute values of the components and despite the resulting variations in the emitter current of Q2. Although FIGURE 2 shows a direct connection between the collector of Q1 and the base of Q2, other conventional coupling circuits, or even additional amplifier stages, may of course be inserted between Q1 and Q2 without affecting the operation of the desired biasing circuit.

The above amplifier has an advantage in its simplicity and stability of design. However, it operates in the class-A, or constant collector current, mode, and is thereby rendered relatively inefficient for use as an oscillator. The resistors R2 and R3 must have large values in order to reduce current drain from B1, but the large voltage drop in these resistors increases their power dissipation and reduces the efficiency of the circuit. Furthermore, the collector load resistor R3 not only dissipates a considerable amount of power when Q2 conducts, but it also limits the power available to a load device when Q2 is non-conducting.

Figure 3:
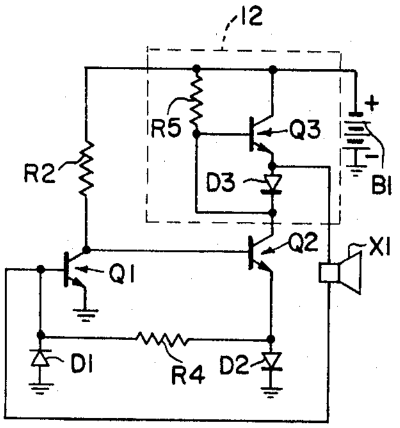
FIGURE 3 illustrates an amplifier according to the invention connected to function as an oscillator.

The oscillator circuit shown in FIGURE 3 eliminates the foregoing disadvantages by incorporating the previously described biasing circuit and by substituting a variable-impedance load circuit 12 for the fixed resistance R3. The variable-impedance load circuit 12 eliminates the disadvantages of the fixed resistor R3 by acting as a large impedance when Q2 is conducting and as a small impedance when Q2 is non-conducting. The load circuit 12 has a transistor Q3 of the same polarity type (NPN or PNP) as that of Q2. The collector of transistor Q3 receives power directly from B1; its emitter is connected to the collector of Q2 through an isolating diode D3. A fixed resistor of relatively high value provides both base bias for Q3 and collector bias for Q2. A resonant transducer X1 is connected to the load circuit 12 between the diode D3 and the emitter of Q3 and to the base of Q1, in order to transform the amplifier into an oscillator. It will be appreciated that the impedance of the load circuit is controlled by the existing state of the transistor Q2. When Q2 is conducting heavily, a large voltage drop exists across R5, and the base of the load-circuit transistor Q3 is thereby biased to prevent Q3 from conducting. This high-resistance state of Q3 prevents the undesired flow of current through X1 during this time, thus increasing the efficiency from one aspect. From another aspect, efficiency is increased because the high value of R5 prevents a large amount of current from flowing through the low saturation resistance of the conducting transistor Q2.

On the other hand, when the transistor Q2 is not conducting, it is desired that the impedance of the load circuit 12 be low in order to minimize power dissipation therein while transmitting maximum current through X1. This effect is achieved by the fact that the now high-resistance state of Q2 causes a sufficiently small voltage drop across R5 that Q3 is biased into a heavily-conducting state, and B1 is thereby connected directly to the transducer X1 except for the very small saturation resistance of Q3. The diode D3 prevents a base-emitter short circuit by presenting a high resistance to current attempting to flow from the base to the emitter of Q3. It will be noted that the diode D3 is connected in reverse polarity to the emitter-base diode of its associated transistor; in this way D3 also acts as a protective device for the transistor Q3 by shunting any reverse voltage around its emitter-base diode. Similarly, a clamping diode D1 is placed in reverse polarity across the emitter-base diode of Q1 in order to protect Q1 against burnout. Typical resistance values for this circuit may be as follows:

| | Ohms |
|---|---|
| R2 | 10K |
| R4 | 1.2K |
| R5 | 3.0K |

Figure 4:
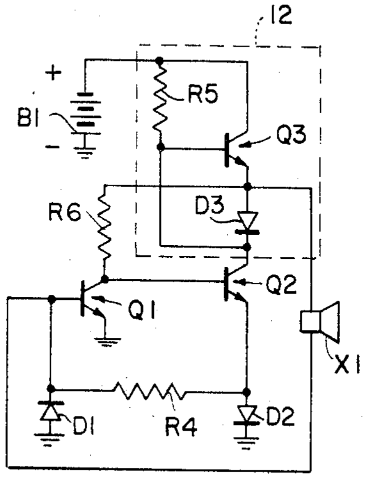
FIGURE 4 shows a variation of the oscillator of FIGURE 3.

Since the transistor Q1 operates at a lower power level than that of Q2, the necessity for a variable-impedance load circuit to replace its collector resistor R2 is not as great. It is possible, however, to provide Q1 with a variable collector bias in a very simple manner in the present circuit. In FIGURE 4, the resistor R2 is replaced by a smaller resistor R6, and this resistor is then connected from the collector of Q1 to the emitter of Q3 in the load circuit 12. Because of the phase relationships necessary for the circuit to oscillate, Q1 must conduct when Q2 is non-conducting, and vice versa. But the state which Q1 must assume in order to sustain oscillation is the same state in which Q3 of the load circuit 12 is to be found. Therefore, collector bias for Q1 may be obtained directly from the load circuit 12, and this bias will be provided only when it is required by Q1, thus allowing an increase in the efficiency of the oscillator as a whole. Typical resistance values for the circuit of FIGURE 3 may be as follows:

| | Ohms |
|---|---|
| R4 | 1.2K |
| R5 | 3.0K |
| R6 | 2.5K |

It will be appreciated that an amplifier or an oscillator according to the present invention thus allows a more efficient operation by its stable biasing means and by its variable-impedance load circuit. This increased efficiency allows greater power output from a given DC input from the potential source B1, and also facilitates production of the circuit in integrated form by reducing the heat dissipation within the circuit and by allowing the use of smaller transistors for Q1 and Q2, since these transistors need no longer carry the entire output current of the circuit. All of these features, as well as the simplicity of the circuit for achieving them, allow such an amplifier or oscillator to be integrated easily and inexpensively.

Having thus described my invention by way of illustration rather than limitation, I claim:

1. An oscillator for a resonant load, comprising: first and second transistor means each having an emitter, base and collector, the collector of said first transistor means being coupled to the base of said second transistor means; a biasing circuit for the base of said first transistor means; a collector load resistor for said first transistor means; a variable-impedance collector load circuit for said second transistor means, said load circuit comprising a transistor means and a biasing means therefor configured in such a manner that said load-circuit transistor means is rendered non-conducting when said second transistor means conducts and vice versa; and a resonant load element connected between said load circuit and the base of said first transistor means.

2. The oscillator of claim 1 wherein said second transistor is biased by means of a diode connected to its emitter.

3. The oscillator of claim 2 wherein said first-transistor base-biasing circuit comprises a resistor connected between the base of said first transistor means and the emitter of said second transistor means.

4. The oscillator of claim 1 wherein said variable-impedance load circuit comprises a third transistor means having a collector, an emitter and a base, said collector being connected to a source of electrical potential and said emitter being connected to a first terminal of a diode, a second terminal of said diode being connected to the collector of said first transistor means and to the base of said third transistor means; and a resistor connected between said source and the base of said third transistor means.

5. The oscillator of claim 4 wherein said first-transistor collector load resistor is connected directed to said source of electrical potential.

6. The oscillator of claim 4 wherein said first-transistor collector load resistor is connected to the emitter of said third transistor means.

7. The oscillator of claim 4 wherein said load element is connected to said load circuit at the junction of said third-transistor emitter and said diode.

8. The oscillator of claim 1 wherein said load element is a resonant electro-acoustical transducer.

9. The oscillator of claim 1 fabricated as a monolithic integrated circuit in a chip of semiconductor material.

References Cited

UNITED STATES PATENTS

| | | | |
|---|---|---|---|
| 2,887,542 | 5/1959 | Blair et al. | 330—24 |
| 3,121,175 | 2/1964 | Vigneron | 330—24 |

JOHN KOMINSKI, *Primary Examiner.*

U.S. Cl. X.R.

330—19, 24, 28, 38; 331—116, 117, 168, 169; 340—384